(12) United States Patent
Huang et al.

(10) Patent No.: US 11,784,214 B2
(45) Date of Patent: Oct. 10, 2023

(54) METHOD FOR FABRICATING METAL-INSULATOR-METAL CAPACITOR

(71) Applicant: UNITED MICROELECTRONICS CORP., Hsinchu (TW)

(72) Inventors: Bo-Wei Huang, Tainan (TW); Chun-Wei Kang, Kaohsiung (TW); Ho-Yu Lai, New Taipei (TW); Chih-Sheng Chang, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/899,807

(22) Filed: Aug. 31, 2022

(65) Prior Publication Data
US 2022/0416013 A1    Dec. 29, 2022

Related U.S. Application Data

(62) Division of application No. 16/862,827, filed on Apr. 30, 2020, now Pat. No. 11,469,294.

(51) Int. Cl.
*H01L 23/64* (2006.01)
*H01L 49/02* (2006.01)

(52) U.S. Cl.
CPC ............ *H01L 28/84* (2013.01); *H01L 23/642* (2013.01); *H01L 28/40* (2013.01)

(58) Field of Classification Search
CPC ........ H01L 28/84; H01L 23/642; H01L 28/40
See application file for complete search history.

(56) References Cited

U.S. PATENT DOCUMENTS

| | | | |
|---|---|---|---|
| 6,232,177 B1* | 5/2001 | Chang ..................... | H01L 28/84 438/398 |
| 6,534,374 B2 | 3/2003 | Johnson et al. | |
| 6,894,331 B2 | 5/2005 | Yoshitomi et al. | |
| 7,329,955 B2 | 2/2008 | Tsau | |
| 7,800,112 B2 | 9/2010 | Ootani et al. | |
| 2003/0011013 A1 | 1/2003 | Joo | |
| 2004/0222493 A1* | 11/2004 | Sato ........................ | H01G 4/005 257/532 |
| 2007/0131997 A1 | 6/2007 | Ohtsuka | |
| 2007/0145525 A1 | 6/2007 | Wang | |
| 2008/0237793 A1 | 10/2008 | Oshida | |
| 2009/0293247 A1 | 12/2009 | Chiang | |
| 2009/0316332 A1 | 12/2009 | Okubo | |
| 2012/0049369 A1 | 3/2012 | Mitsuyama | |
| 2014/0159198 A1 | 6/2014 | Ren | |

(Continued)

FOREIGN PATENT DOCUMENTS

TW        I673736        10/2019

*Primary Examiner* — Ahmed N Sefer
(74) *Attorney, Agent, or Firm* — WPAT, P.C

(57) ABSTRACT

A method for fabricating a metal-insulator-metal (MIM) capacitor is provided. The MIM capacitor includes a substrate, a first metal layer, a deposition structure, a dielectric layer and a second metal layer. The first metal layer is disposed on the substate and has a planarized surface. The deposition structure is disposed on the first metal layer, and at least a portion of the deposition structure extends into the planarized surface, wherein the first metal layer and the deposition structure have the same material. The dielectric layer is disposed on the deposition structure. The second metal layer is disposed on the dielectric layer.

5 Claims, 6 Drawing Sheets

(56) References Cited

U.S. PATENT DOCUMENTS

| | | |
|---|---|---|
| 2015/0243730 A1 | 8/2015 | Cheng |
| 2016/0043060 A1 | 2/2016 | Kabe |
| 2018/0277621 A1 | 9/2018 | Ando |
| 2020/0105865 A1 | 4/2020 | Hu |
| 2020/0135406 A1* | 4/2020 | Aburakawa ............ H01G 4/012 |
| 2020/0388669 A1 | 12/2020 | Schultz |
| 2021/0074630 A1 | 3/2021 | Eissa |
| 2021/0074805 A1* | 3/2021 | Lin ..................... H01L 23/5223 |

* cited by examiner

METHOD FOR FABRICATING METAL-INSULATOR-METAL CAPACITOR

The application is a divisional application of U.S. patent application Ser. No. 16/862,827, filed on Apr. 30, 2020, which claims the benefit of People's Republic of China application Serial No. 202010173258.7, filed Mar. 13, 2020, the subject matter of which is incorporated herein by reference.

BACKGROUND

Technical Field

The disclosure relates to a method for fabricating a semiconductor device, and more particularly to a method for fabricating a metal-insulator-metal (MIM) capacitor.

Description of the Related Art

Because of the properties and the technical advantage of providing non-lossy and highly conductive electrodes, suitable for high-speed applications, and lower cost, MIM capacitors are widely used in semiconductor integrated circuit (IC) manufacturing processes. For example, a MIM capacitor can be applied to a dynamic random-access memory (DRAM) device serving as a scalable storage node capacitor with embedded design, or can be embedded in a radio frequency (RF) analog device.

A typical MIM capacitor includes a bottom electrode, an upper electrode and a dielectric layer disposed between the bottom electrode and the upper electrode and usually composed of a high dielectric constant (High-k) material. The method for manufacturing the MIM capacitor usually includes steps as follows: a multiple-layers structure of conductive material layer/dielectric material layer/conductive material layer is formed on a semiconductor substrate by sequentially performing a plurality of deposition processes, such as physical vapor depositions (PVD); and the multiple-layers structure of conductive material layer/dielectric material layer/conductive material layer is then patterned by using an etching process. However, during the forming of the bottom electrode, columnar crystal structures are easily generated due to the deposition of the conductive material layer, which may result in poor interface flatness between the upper surface of the bottom electrode and the dielectric layer formed above it; and this may affect the overall reliability of the device (the reliability of the MIM capacitor).

Therefore, there is a need of providing an improved MIM capacitor and the method for fabricating the same to obviate the drawbacks encountered from the prior art.

SUMMARY

One aspect of the present disclosure is to provide a MIM capacitor, wherein the MIM capacitor includes a substrate, a first metal layer, a deposition structure, a dielectric layer and a second metal layer. The first metal layer is disposed on the substate and has a planarized surface. The deposition structure is disposed on the first metal layer, and at least a portion of the deposition structure extends into the planarized surface, wherein the first metal layer and the deposition structure have the same material. The dielectric layer is disposed on the deposition structure. The second metal layer is disposed on the dielectric layer.

Another aspect of the present disclosure is to provide a method for fabricating a MIM capacitor, wherein the method includes steps as follows: A first metal layer is firstly formed on a substrate. A planarization process is then performed to make the first metal layer having a planarized surface. A deposition process is performed to form a deposition structure on the first metal layer to make the deposition structure at least partially extending into the planarized surface, wherein the first metal layer and the deposition structure have the same material. Subsequently, a dielectric layer is formed on the deposition structure, and a second metal layer is formed on the dielectric layer.

In accordance with the aforementioned embodiments of the present disclosure, a MIM capacitor and the method for fabricating the same are provided. It is characterized by the following steps: After the bottom electrode is formed on the substrate, a planarization process is performed on the bottom electrode to make the bottom electrode having a planarized surface. Next, a deposition structure having the same material as compositing of the bottom electrode is formed on the planarized surface of the bottom electrode. By performing the planarization to form the planarized surface on the bottom electrode, on the one hand, a larger processing window can be provided to other material layers formed on the planarized surface in the subsequent processes to improve the processing yield of the MIM capacitor. The contact area between the bottom electrode and the dielectric layer, on the other hand, can be increased by forming the deposition structure formed on the planarized surface, so that the reliability of the MIM capacitor can be greatly improved without deteriorate the capacitance capacity thereof.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
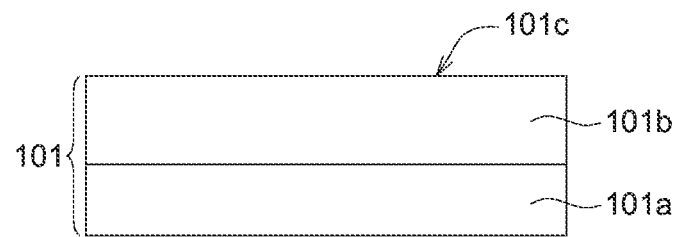
FIGS. 1A to 1G are cross-sectional views illustrating a series of the processing structure for fabricating a MIM capacitor, in accordance with one embodiment of the present disclosure.

The embodiments as illustrated below provide a MIM capacitor and the method for fabricating the same to increase the interface flatness between the electrode and the dielectric layer of the MIM capacitor, and to improve the reliability of the MIM capacitor without deteriorate the capacitance capacity thereof. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIG. 1A to 1G are cross-sectional views illustrating a series of the processing structure for fabricating a MIM capacitor 100, in accordance with one embodiment of the present disclosure. The method for fabricating the MIM capacitor 100 includes steps as follows: First, a substrate 101 is provided. The substrate 101 may be a semiconductor substrate. For example, in some embodiments of the present disclosure, the substrate 101 may be made of a semiconductor material, such as silicon (Si), germanium (Ge), or a compound semiconductor material, such as gallium arsenide (GaAs). Alternatively, in other embodiments, the substrate 101 may be a silicon on Insulator (SOI) substrate.

In some embodiments of the present disclosure, the substrate 101 may be a silicon-containing substrate. For example, in the present embodiment, the substrate 101 can be a silicon wafer, which includes a silicon substrate 101a and an insulating layer 101b formed on the silicon substrate 101a (see FIG. 1A). However, the structure of the substrate 101 may not be limited to this regard. In some other embodiments, the substrate 101 may further include at least one metal layer, microelectronic or micromechanical structure (not shown) formed in the silicon substrate 101a.

Next, a first metal layer 102 is formed on the substrate 101. In some embodiments of the present disclosure, the forming of the first metal layer 102 includes performing at least one deposition process, such as a PVD process, a chemical vapor deposition (CVD) process, a sputtering process, or other suitable processes, to deposit at least one conductive material layer on the surface 101c of the substrate 101, such that the first metal layer 102 having a thickness substantially ranging from 600 nanometers (nm) to 800 nm (for example, may be about 700 nm) can be formed on the surface 101c of the substrate 101. The conductive material used to form the first metal layer 102 may include tantalum nitride (TaN), tantalum (Ta), titanium nitride (TiN), titanium tungsten (TiW), chromium-nickel alloy (NiCr), molybdenum nitride (MoN), tungsten nitride (WN), and tungsten silicon nitride (WSiN) or one of the arbitrary combinations thereof.

Figure 1B:
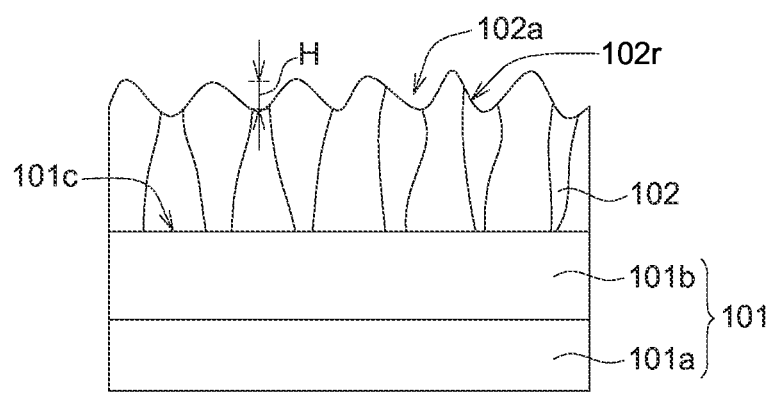
Figure 1C:
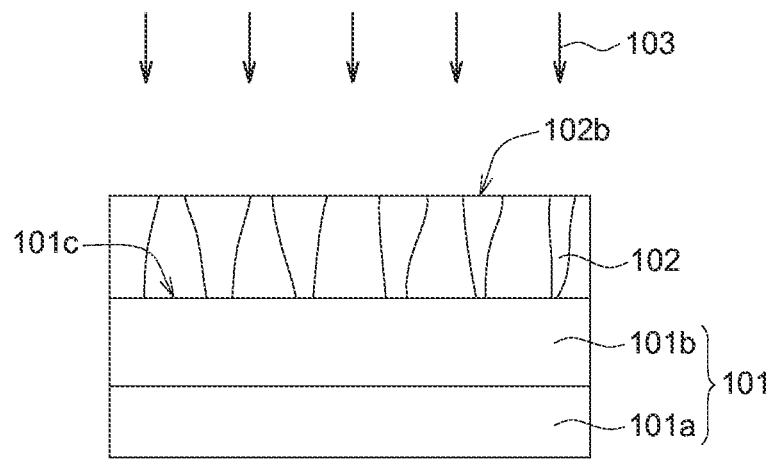

In the present embodiment, the first metal layer 102 is a titanium nitride layer formed by a PVD process. The upper surface 102a of the first metal layer 102 may have a plurality of recesses 102r. The average depth H of the recesses 102r may substantially ranging from 3.72 nm to 25.10 nm, so that the upper surface 102a of the first metal layer 102 has a surface roughness with an arithmetic mean deviation (Ra) ranging from 2.35 nm to 2.45 nm (e.g, about 2.41 nm) (as shown in FIG. 1B).

A first planarization process 103 is then performed on the first metal layer 102 to make the planarized first metal layer 102 having a planarized surface 102b. In some embodiments of the present disclosure, the first planarization process 103 may include steps of applying a chemical mechanical polishing (CMP) or an etching technology to remove a portion of the conductive material below the upper surface 102a of the first metal layer 102a, and to make the planarized first metal layer 102 still remaining a thickness substantially ranging from 200 nm to 400 nm.

For example, in some embodiments of the present disclosure, after the first planarization process 103 is performed, the planarized first metal layer 102 (the remaining portion of the first metal layer 102) still has a thickness about 300 nm, and the underlying substrate 101 is not exposed to the outside. The planarized surface 102b has a surface roughness with a Ra ranging from 0.18 nm to 2.02 nm. In the present embodiment, the planarized surface 102b of the planarized first metal layer 102 has a surface roughness with a Ra about 0.09 nm (as shown in FIG. 1O).

There in after, a first deposition process 104 is performed using the same material constituting of the first metal layer 102 to form a deposition structure 105 on the first metal layer 102. In some embodiments of the present disclosure, the forming of the deposition structure 105 includes performing a deposition process, such as a PVD process, a CVD process, a sputtering process, or other suitable processes, to deposit a conductive material layer (such as, a metal layer) made of the same material as the first metal layer 102 on the planarized surface 102b of the first metal layer 102 and having a thickness substantially ranging from 50 nm to 200 nm. In the present embodiment, the first deposition process 104 can be a PVD process, and the deposition structure 105 can be a titanium nitride layer with a thickness about 100 nm.

Figure 1D:
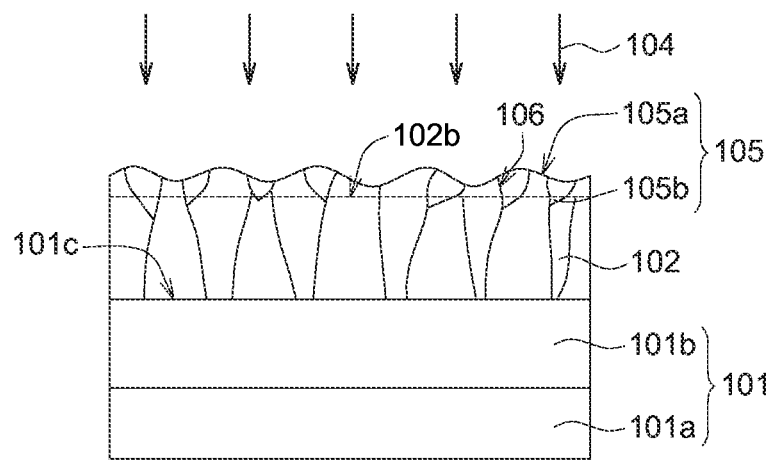

In some embodiments of the present disclosure, the first deposition process 104 for forming the deposition structure 105 may include a processing temperature substantially ranging from 250° C. to 300° C. (e.g, about 275° C.), which may cause a par t of the titanium nitride layer (the deposition structure 105) melted to form a protruding portion 105b extending into the planarized first metal layer 102 from the planarized surface 102b (as shown in FIG. 1D), so as to result in a deposition surface 105a on the side far from the planarized surface 102b of the first metal layer 102.

Wherein, the deposition surface 105a of the deposition structure 105 has a second roughness, and the second roughness is substantially larger than the first roughness of the planarized surface 102b of the first metal layer 102. In some embodiments of the present disclosure, the deposition surface 105a has a second surface roughness with a Ra ranging from 0.78 nm to 8.48 nm. In the present embodiment, the deposition surface 105a of the deposition structure 105 has a second roughness with a Ra about 0.51 nm.

Although, the first planarization process 103 can provide the first metal layer 102 a flattened surface 102b with better uniformity, which is beneficial to subsequent process yields of other material layers formed on the planarized surface 102b. This approach may still have drawbacks. For example, as the flatness of the planarized surface 102b increases, it's per unit surface area decreases accordingly, which will cause the capacitance of the MIM capacitor 100 with the first metal layer 102 as the bottom electrode to decrease. Therefore, those with ordinary skills in the art may make a trade-off between the process yield and capacitance of the MIM capacitor 100 according to the disclosure and the design requirements of the MIM capacitor 100, so as to significantly improve the reliability of the MIM capacitor 100 without deteriorating the capacitance thereof. For example, in the present embodiment, the ratio of the first roughness of the planarized surface 102b of the first metal layer 102 to the second roughness of the deposition surface 105a of the deposition structure 105 may range from 0.021 to 2.589; preferably may range from 0.231 to 0.238.

It should be appreciated that although the first metal layer 102 and the deposition structure 105 are constituted by the same material, since the two are formed by different deposition processes, thus there may still exit a grain boundary 106 generated between the planarized surface 102b of the first metal layer 102 and the deposition structures 105; and the grain boundary 106 can be identified by some measuring instruments, such as (but not limited to) a scanning electron microscope (SEM), a transmission electron microscope (TEM), or other suitable measuring instruments.

Figure 1E:
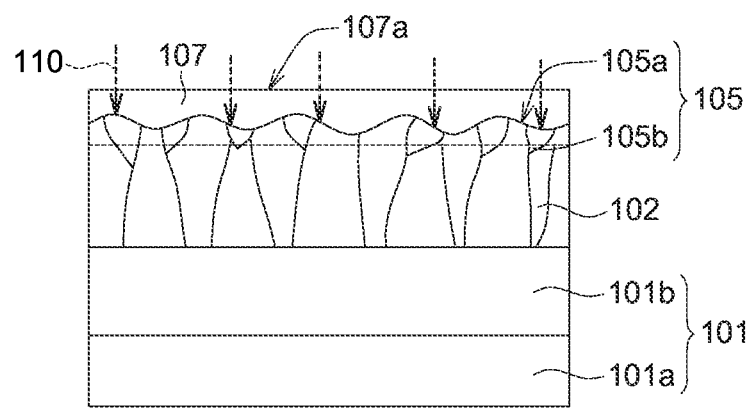

Subsequently, a dielectric layer 107 is formed on the deposition structure 105. In some embodiments of the present disclosure, the forming of the dielectric layer 107 includes performing at least one deposition process, such as a PVD process, a CVD process, a sputtering process, or other suitable processes, on the deposition surface 105a of the deposition structure 105 to form a dielectric material layer having a thickness substantially ranging from 0.78 nm to 8.48 nm, so as to make the dielectric layer 107 directly in contact with the deposition surface 105a of the deposition structure 105 (as shown in FIG. 1E).

The dielectric material used to form the dielectric layer 107 may include silicon nitride (SiN), tantalum pentoxide ($Ta_2O_5$), silicon oxynitride (SiON), zirconia ($ZrO_2$), hafnium oxide ($HfO_2$), aluminum oxide ($Al_2O_3$), Yttrium oxide ($Y_2O_3$), magnesium oxide (MgO), titanium oxide ($TiO_2$), ferroelectric materials (ferroelectric materials) or other high-dielectric materials or one of the arbitrary combinations thereof. In yet some other embodiments of the present disclosure, the dielectric layer 107 may have a single-layer structure or a multilayer structure. For example, in the present embodiment, the dielectric layer 107 may be a single-layer silicon nitride layer formed by a PVD process and having a thickness of about 60 nm.

In some embodiments of the present disclosure, prior to the forming of the dielectric layer 107, an optional nitrogen treatment process 110 can be selectively performed on the deposition surface 105a of the deposition structure 105, using nitrogen ($N_2$) to remove water vapor attached to the deposition surface 105a, and simultaneously to reduce the oxidized silicon oxynitride (SiON) disposed on the deposition surface 105a into silicon nitride. In the embodiment, the nitrogen flow rate of the nitrogen treatment process 110 may substantially range from 4000 sccm to 6000 sccm.

Figure 1F:
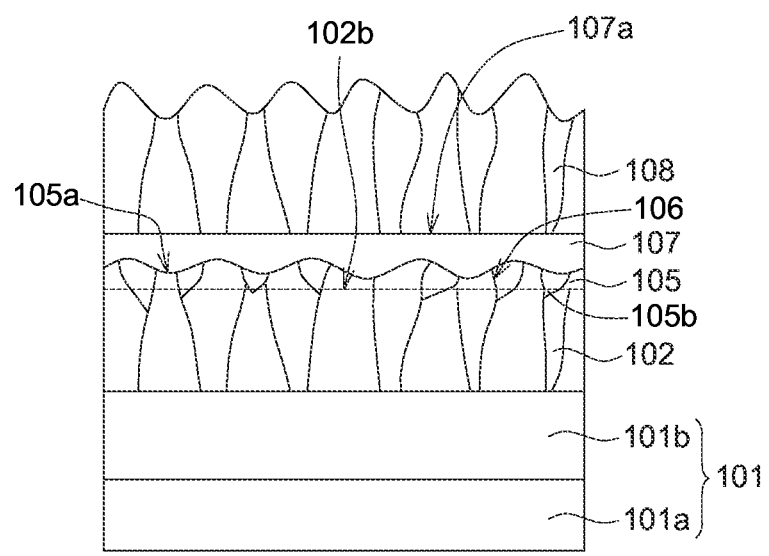

After the dielectric layer 107 is formed, a second metal layer 108 is formed on the dielectric layer 107. In some embodiments of the present disclosure, the forming of the dielectric layer 107 includes performing at least one deposition process (as shown in FIG. 1F), such as a PVD process, a CVD process, a sputtering process, or other suitable processes, to form a conductive material layer having a thickness substantially ranging from 500 nm to 700 nm on the surface 107a of the dielectric layer 107. The conductive material used to form the second metal layer 108 may be the same as or different from the conductive material used to form the first metal layer 102. In the present embodiment, the second metal layer 108 may be a titanium nitride layer formed by a PVD process and having a thickness of about 600 nm.

Figure 1G:
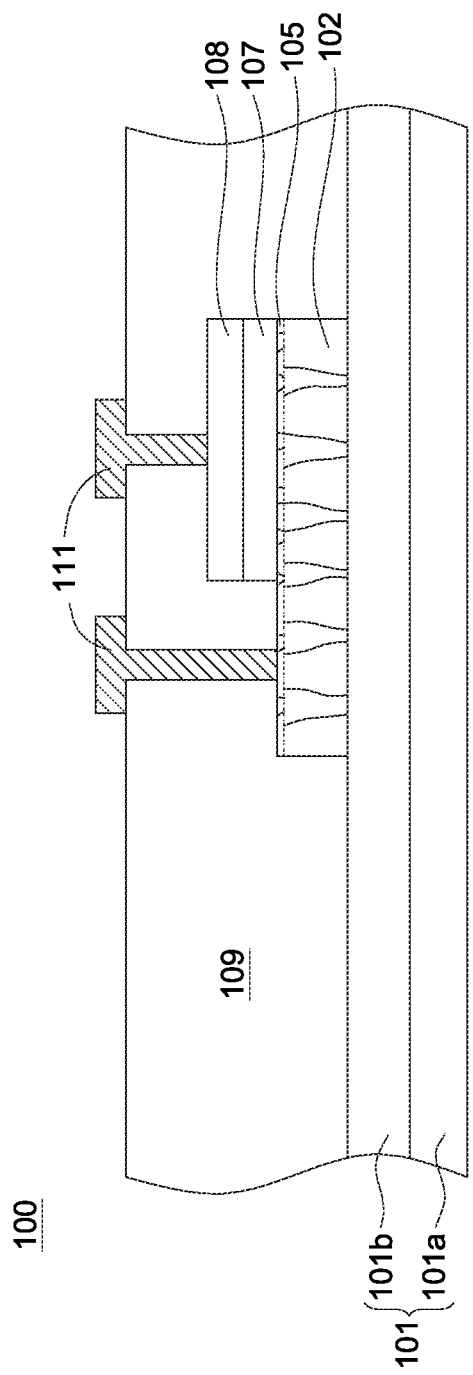

After a series of downstream processes, for example, patterning the first metal layer 102, the dielectric layer 107 and the second metal layer 108, and forming a passivation layer 109 and a contact circuit 111 on the patterned first metal layer 102, the patterned dielectric layer 107 and the patterned second metal layer 108, the process for forming the MIM capacitor 100 as shown in FIG. 1G can be accomplished.

The MIM capacitor 100 provided by the aforementioned embodiment and the conventional MIM capacitors that have not been subjected to the first planarization process 103 and/or does not include the deposition structure 105 are subjected to a dielectric breakdown test (such as, a time dependent dielectric breakdown test, TDDB test) to determine the reliability of each MIM capacitors. After comparing the test results, it can be found that the maximum operating voltage of the MIM capacitor 100 provided by the process as shown in FIGS. 1A to 1G can far higher than that of the conventional MIM capacitors. It can be seen that the MIM capacitor 100 provided by the embodiment of the present disclosure has better reliability than that of the conventional MIM capacitors.

Figure 2A:
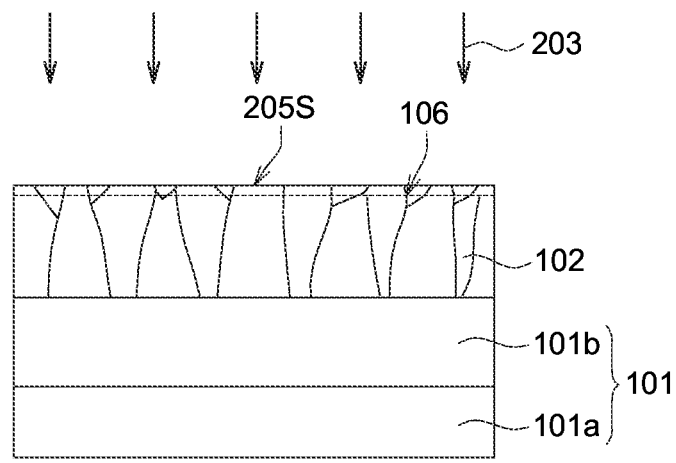
FIG. 2A to 2C are cross-sectional views illustrating a portion of the processing structure for fabricating a MIM capacitor, in accordance with another embodiment of the present disclosure.
Figure 2B:
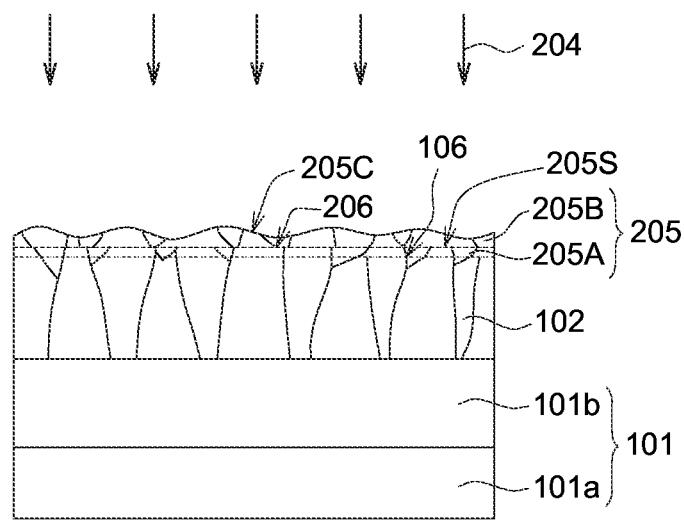
Figure 2C:
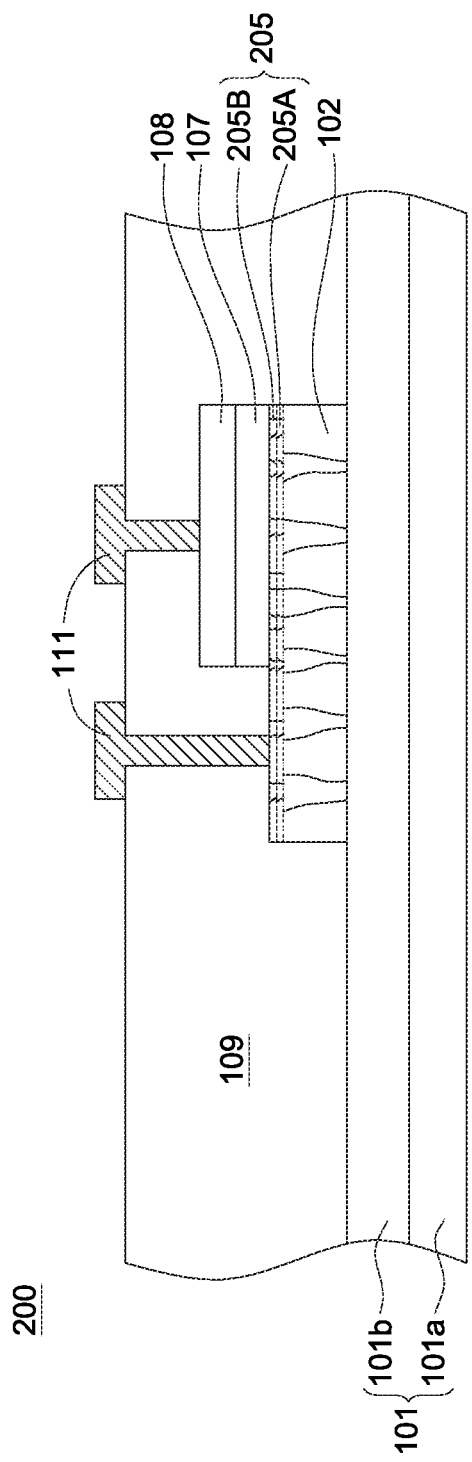

However, the structure of the MIM capacitor and the method for fabricating the same provided by the present disclosure is not limited to this regard. FIG. 2A to 2C are cross-sectional views illustrating a portion of the processing structure for fabricating a MIM capacitor 200, in accordance with another embodiment of the present disclosure. The method for manufacturing the MIM capacitor 200 is similar to the method for manufacturing the MIM capacitor 100; and the difference therebetween lies on the method for forming the deposition structure 205. Since the identical steps and processing structures for forming the MIM capacitors 100 and 200 are clearly described above, thus mere the different steps and processing structures are described, and the process for forming the MIM capacitor 200 is continued from FIG. 1B.

In the present embodiment, the forming of the deposition structure 205 includes steps as follows: Firstly, a first deposition process 104 (as shown in FIG. 1B) is performed using the same material as the first metal layer 102 to form a first deposition layer 205A on the first metal layer 102. Then, a second planarization process 203 is performed on the first deposition layer 205A (as shown in FIG. 2A). The second planarization process 203 may include steps of applying a CMP or an etching technology to remove a portion of the conductive material below the upper surface of the first deposition layer 205A, so that the first deposition layer 205A has a planarized surface 205S having a roughness with a Ra about 0.09 nm.

Next, a second deposition process 204 is performed using the same material as the first metal layer 102 to form a second deposition layer 205B on the planarized first deposition layer 205A. The combination of the first deposition layer 205A and the second deposition layer 205B constitutes a deposition structure 205 (as shown in FIG. 2B). The second deposition layer 205B has a deposition surface 205c on the side far from the first deposition layer 205A; and the deposition surface 205c has a second roughness, which is substantially larger than the first roughness of the planarized surface 102b of the first metal layer 102. In the present embodiment, the deposition surface 205c of the deposition structure 205 has a second roughness with a Ra about 0.51 nm.

It should be appreciated that although the first metal layer 102, the first deposition layer 205A and the second deposition layer 205B are constituted by the same material, since these three are formed by different deposition processes, thus there may still exit a grain boundary 106 generated between the planarized surface 102b of the first metal layer 102 and the first deposition layer 205A and another grain boundary 206 generated between the first deposition layer 205A and the second deposition layer 205B; and theses grain boundaries 106 and 206 can be identified by some measuring instruments, such as (but not limited to) a SEM, a TEM, or other suitable measuring instruments.

In addition, the number of deposition layers of the deposition structure 205 is not limited to this regard. Those with ordinary skills in the art may further repeat the aforementioned second planarization process 203 and the second deposition process 204 to make the deposition structure 205 including more deposition layers, according to the disclosure in this disclosure and the design requirements of the MIM capacitor 200.

Subsequently, a dielectric layer 107 and a second metal layer 108 are sequentially formed on the deposition structure 205; and after a series of downstream processes, for example, patterning the first metal layer 102, the deposition structure 205, the dielectric layer 107 and The second metal layer 108, and forming a passivation layer 109 and a contact circuit 111 on the patterned first metal layer 102, the patterned deposition structure 205, the patterned dielectric layer 107 and the patterned second metal layer 108, the process for forming the MIM capacitor 200 as shown in FIG. 2C can be accomplished.

The MIM capacitor 200 provided by the aforementioned embodiment and the conventional MIM capacitors that have not been subjected to the first planarization process 103 and/or does not include the deposition structure 205 are subjected to a dielectric breakdown test (such as, a TDDB test) to determine the reliability of each MIM capacitors. After comparing the test results, it can be found that the maximum operating voltage of the MIM capacitor 200 provided by the process as shown in FIGS. 2A to 2C can far higher than that of the conventional MIM capacitors. It can be seen that the MIM capacitor 200 provided by the embodiment of the present disclosure has better reliability than that of the conventional MIM capacitors.

In accordance with the aforementioned embodiments of the present disclosure, a MIM capacitor and the method for fabricating the same are provided. It is characterized by the following steps: After the bottom electrode is formed on the substrate, a planarization process is performed on the bottom electrode to make the bottom electrode having a planarized surface. Next, a deposition structure having the same material as compositing of the bottom electrode is formed on the planarized surface of the bottom electrode. By performing the planarization to form the planarized surface on the bottom electrode, on the one hand, a larger processing window can be provided to other material layers formed on the planarized surface in the subsequent processes to improve the processing yield of the MIM capacitor. The contact area between the bottom electrode and the dielectric layer, on the other hand, can be increased by forming the deposition structure formed on the planarized surface, so that the reliability of the MIM capacitor can be greatly improved without deteriorate the capacitance capacity thereof.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a MIM capacitor, comprising:
   forming a first metal layer on a substrate;
   performing a planarization process to make the first metal layer having a planarized surface;
   performing a first deposition process to form a deposition structure on the first metal layer to make the deposition structure at least partially extending into the planarized surface, wherein the first metal layer and the deposition structure have the same material, and the deposition structure has a deposition surface;
   forming a dielectric layer on the deposition structure; and
   forming a second metal layer on the dielectric layer,
   wherein the planarized surface has a first roughness, the deposition surface has a second roughness, and a ratio of the first roughness to the second roughness ranges from 0.021 to 2.589.

2. The method according to claim 1, prior to the forming of the dielectric layer, further comprising performing a nitrogen treatment process on the deposition surface of the deposition structure.

3. The method according to claim 1, wherein the forming of the deposition structure further comprises performing a second deposition process after the first deposition process is carried out.

4. The method according to claim 3, wherein the first deposition process forms a first deposition layer; the second deposition process forms a second deposition layer; and the combination of the first deposition layer and the second deposition layer constitutes the deposition structure.

5. The method according to claim 1, wherein planarization process comprises applying a chemical mechanical polishing (CMP) or an etching technology to remove a portion of the first metal layer.

* * * * *